(12) United States Patent
Inaba et al.

(10) Patent No.: US 10,961,963 B2
(45) Date of Patent: *Mar. 30, 2021

(54) INJECTION CONTROL DEVICE

(71) Applicant: DENSO CORPORATION, Kariya (JP)

(72) Inventors: Masashi Inaba, Kariya (JP); Noboru Nagase, Kariya (JP); Taichi Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 112 days.

This patent is subject to a terminal disclaimer.

(21) Appl. No.: 16/382,549

(22) Filed: Apr. 12, 2019

(65) Prior Publication Data
US 2019/0323466 A1    Oct. 24, 2019

(30) Foreign Application Priority Data

Apr. 20, 2018 (JP) .............................. JP2018-081376
Dec. 7, 2018 (JP) .............................. JP2018-230008

(51) Int. Cl.
*F02M 59/46* (2006.01)
*H03K 17/082* (2006.01)

(52) U.S. Cl.
CPC ....... *F02M 59/466* (2013.01); *H03K 17/0822* (2013.01)

(58) Field of Classification Search
CPC ........ F02D 41/365; F02D 41/20; F02D 41/24; F02D 2041/281; F02D 2041/2075; F02D 2041/2013; F02D 2041/2024; F02D 2041/2003; F02M 21/0242

See application file for complete search history.

(56) References Cited

U.S. PATENT DOCUMENTS

2009/0107469 A1 *  4/2009  Takahashi .............. F02D 41/20
                                                                      123/490

FOREIGN PATENT DOCUMENTS

| JP | 2005-344603 A | 12/2005 |
| JP | 2016-160920 A | 9/2016 |
| JP | 2018-093044 A | 6/2018 |

OTHER PUBLICATIONS

U.S. Appl. No. 16/382,438, filed Apr. 12, 2019, Inaba et al.

\* cited by examiner

*Primary Examiner* — Xiao En Mo
(74) *Attorney, Agent, or Firm* — Posz Law Group, PLC

(57) ABSTRACT

An injection control device controls a drive of a solenoid in a high pressure pump for pressurizing fuel to an internal combustion engine. The injection control device includes a transistor on an upstream side of a power supply path from a direct current power supply line to the solenoid and a transistor provided on a downstream side of the power supply path. The injection control device further includes a diode at a position between an upstream terminal of the solenoid and ground, a transistor arranged in parallel with the diode, and a drive controller. The drive controller drives the solenoid to an open position by switching ON the transistors on the upstream and downstream sides of the power supply path.

5 Claims, 4 Drawing Sheets

INJECTION CONTROL DEVICE

CROSS REFERENCE TO RELATED APPLICATION

The present application is based on and claims the benefit of priority of Japanese Patent Applications No. 2018-081376, filed on Apr. 20, 2018, and No. 2018-230008, filed on Dec. 7, 2018, the disclosures of which are incorporated herein by reference.

TECHNICAL FIELD

The present disclosure relates to an injection control device for controlling a solenoid of a high pressure pump that pressurizes fuel for an internal combustion engine.

BACKGROUND INFORMATION

Injection control devices may be used to control the operation of solenoids for providing pressurized fuel to internal combustion engines in vehicles. The switching elements used to realize such solenoid operations may cause both a forward current to flow through the solenoid and a return current to flow from the solenoid. The return current may cause a heat loss to occur in the injection control device. As such, injection control devices are subject to improvement.

SUMMARY

The present disclosure describes an injection control device capable of reducing heat loss in the injection control device.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
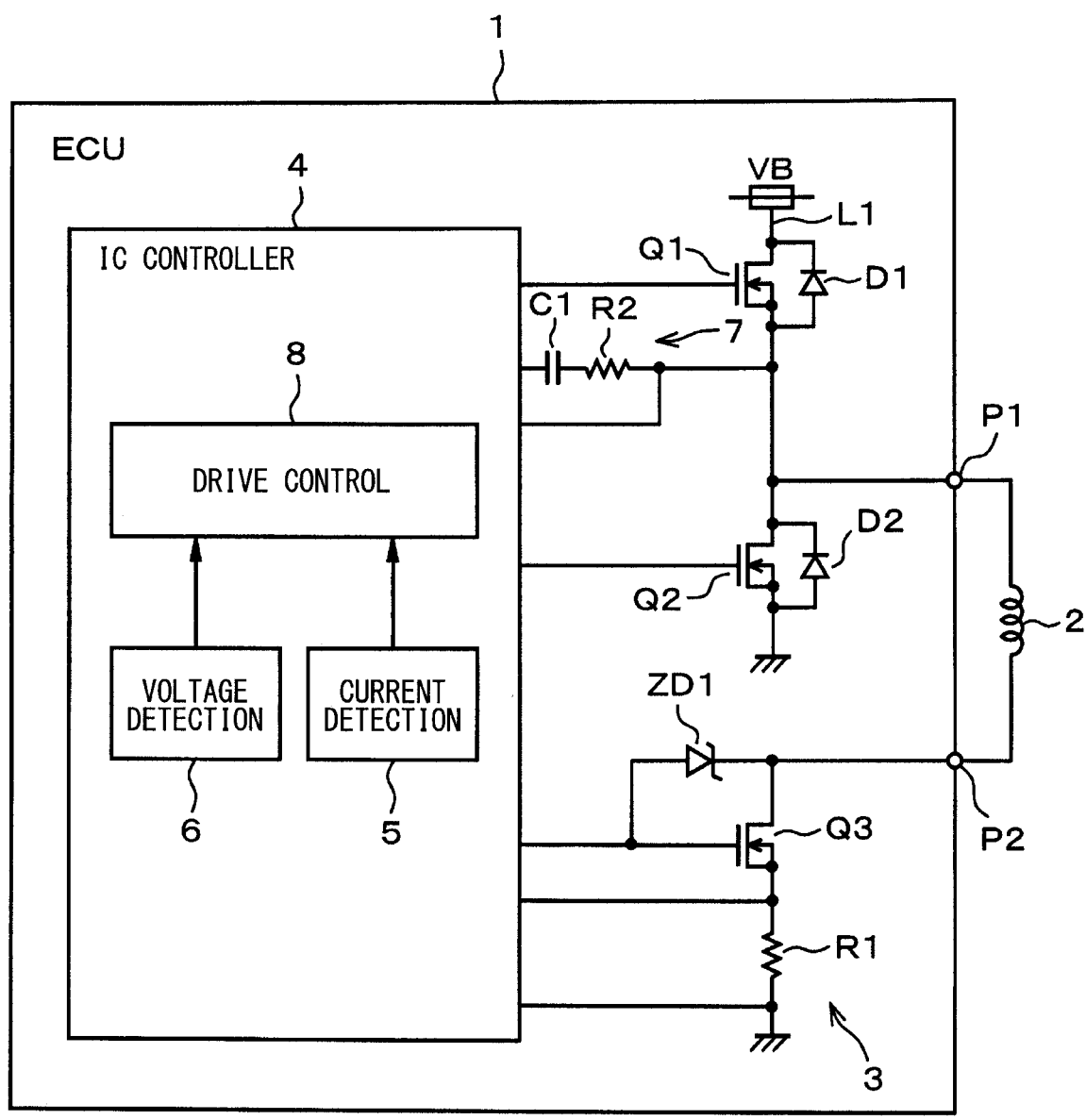
FIG. 1 illustrates a schematic configuration of an injection control device in a first embodiment of the present disclosure.

An injection control device for controlling the fuel injection of an internal combustion engine functions by controlling the operation of a solenoid in a high pressure pump that pressurizes fuel to the engine. Such injection control devices may include an upstream switch provided on an upstream side of the power supply path from a direct current (DC) power supply line supplying a battery voltage to the solenoid, and a downstream switch provided on a downstream side of the power supply path (e.g., the power return path from the solenoid). By switching ON the upstream switch and the downstream switch, power from the battery can be applied to the solenoid.

Such configurations may use a reflux diode is to control the flow of a return current that is generated when the current supply to the solenoid is interrupted when the upstream side switch is turned OFF. In such instances, the reflux diode may cause heat loss when current flows through the reflux diode in a forward direction. Since the heat loss is in proportion to the forward voltage of the reflux diode, the heat losses in such injection control devices may be relatively large and cause problems in the design and operation of the injection control device.

The embodiments of the present disclosure are described with reference to the drawings. In the following embodiments, like features and elements among the embodiments may be referred to by the same reference numerals, and a repeat description of previously described like features and elements may be omitted from the descriptions of the latter embodiments.

First Embodiment

The first embodiment of the present disclosure is described with reference to FIGS. 1 and 2.

Figure 2:
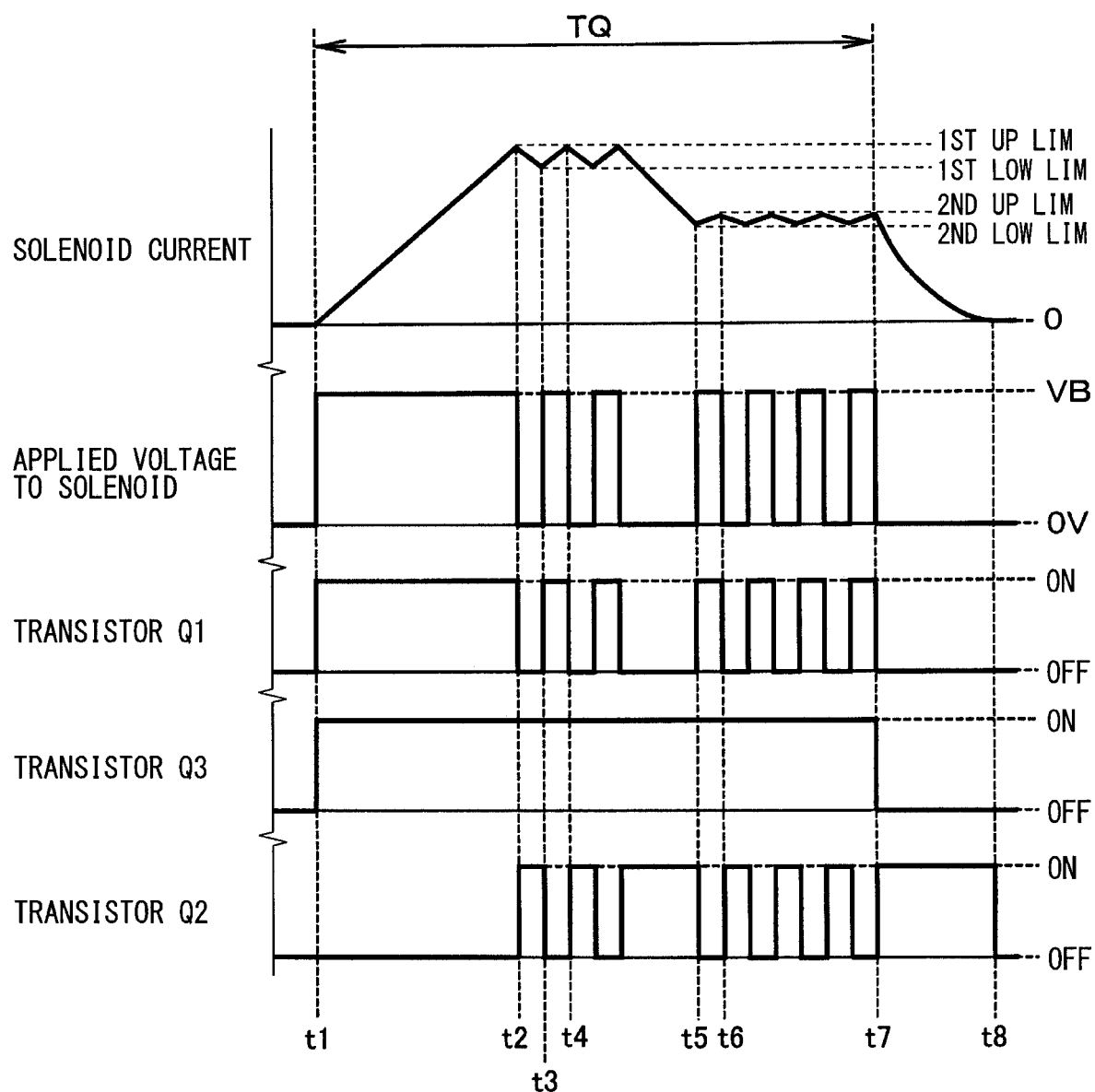
FIG. 2 is a timing chart of a solenoid current, an application voltage to a solenoid, and a drive state of each transistor in the first embodiment.

In FIG. 1, an injection control device 1 is one of a plurality of electronic control devices or electronic control units (ECUs) installed in a vehicle. The electronic control devices may also be referred to as electronic control units (ECUs). The injection control device 1 controls the fuel injection of an internal combustion engine in a vehicle. The injection control device 1 may be referred to simply as an engine ECU 1. The engine ECU 1 integrally controls various actuators based on various sensor signals during various vehicle operations to operate the vehicle in an optimum engine state.

The injection control device 1 controls a high pressure pump for controlling the flow of pressurized fuel to the engine. More specifically, the injection control device 1 drives or controls a drive of the high pressure pump, where "drive" may mean transmitting power or not transmitting power to control the operation of the high pressure pump. The high pressure pump has a solenoid-type electromagnetic valve 2. The solenoid-type electromagnetic valve 2 may be referred to simply as a solenoid 2. The injection control device 1 controls an electric current flowing to the solenoid 2 of the high pressure pump, to control an amount of pressurized fuel discharged from the high pressure pump. Specifically, the injection control device 1 controls a power supply to the solenoid 2 to drive the solenoid 2 (i.e., the valve) to open and closed positions, to control the flow of the pressurized fuel. As such, the injection control device 1 functions to control the drive of the solenoid 2.

A battery voltage VB output from a vehicle-mounted battery (not shown) is supplied via a direct current (DC) power supply line L1 to the injection control device 1. The battery voltage VB may also be referred to as a DC voltage. The injection control device 1 has terminals P1 and P2 for connecting the solenoid 2. An upstream terminal (i.e., the power supply terminal) of the solenoid 2 is connected to the terminal P1 and a downstream terminal (i.e., the power return terminal) of the solenoid 2 is connected to the terminal P2. Upstream and downstream may be used to indicate a position of an element in the injection control device 1 relative to the power supply path of the solenoid 2, where the power supply path to the solenoid 2 may be referred to as "upstream," and the return path from the solenoid 2 may be referred to as "downstream." Similarly, an upstream terminal of the solenoid 2 may refer to the terminal on the power supply side of the solenoid 2 and the downstream terminal of the solenoid 2 may refer to the terminal on the power return side of the solenoid 2.

The injection control device 1 includes a drive circuit 3 and an integrated circuit (IC) controller 4. The IC controller 4 may be a system on a chip (SoC) integrated circuit-type controller 4 that includes computer and electronic components such as a processor (CPU), memory, input/output (I/O) ports such as terminals, a bootstrap diode, and like components on a single substrate in an integrated circuit package.

The drive circuit 3 also includes transistors Q1, Q2, and Q3 (i.e., transistors Q1-Q3), diodes D1 and D2, a Zener diode ZD1, resistors R1 and R2, and a capacitor C1. The transistors Q1-Q3 are N-channel type metal-oxide-semiconductor field-effect transistors (i.e., n-type MOSFETs). Each of the transistors Q1-Q3 has a body diode connected between the drain and the source, with the anode of the diode positioned on a source side and the cathode of the diode positioned on the drain side. In FIG. 1, only the diodes D1 and D2 that are the body diodes for the transistors Q1 and Q2 are shown, and illustrations of the other body diodes connected between the source and drain of the other transistors (e.g., Q3) are omitted.

The drain of the transistor Q1 is connected to the DC power supply line L1 and the source of the transistor Q1 is connected to the terminal P1. DC power supply line L1 supplies the battery voltage VB. The transistor Q1 is disposed at a position upstream of the power supply path from the DC power supply line L1 to the solenoid 2. As such, the transistor Q1 may be referred to as a first upstream switch Q1.

The cathode of the diode D2 is connected to the terminal P1, and the anode of the diode D2 is connected to ground (e.g., a return path) at which there is a ground potential of 0 V, that is, a reference potential of the circuit. The diode D2 allows a return current to flow when the current supply to the solenoid 2 is cut off by turning OFF of the transistor Q1. As such, the diode D2 is connected between the upstream terminal of the solenoid 2 and ground and may be referred to as a reflux diode D2.

The source of the transistor Q2 is connected to ground and the drain of the transistor Q2 is connected to the terminal P1. The transistor Q2 is disposed in parallel with the diode D2 at a position between at position between the upstream terminal of the solenoid 2 and ground. The transistor Q2 may also be referred to as a short circuit switch Q2.

The drain of the transistor Q3 is connected to the terminal P2, and the source of the transistor Q3 is connected to ground via the resistor R1. The transistor Q3 is disposed at a position on the downstream side (i.e., power return side) of the power supply path, and as such, may be referred to as a downstream switch Q3. The Zener diode ZD1 is connected at a position between the gate and the drain of the transistor Q3 with the anode of the Zener diode ZD1 connected to the gate of the transistor Q3 and the cathode of the Zener diode ZD1 connected to the terminal P2. The Zener diode ZD1 operates to clamp a gate voltage of the transistor Q3, and by such operation prevents an excessive voltage that exceeds the breakdown voltage of the Zener diode ZD1 from being applied to the gate of the transistor Q3.

A drive signal output from the IC controller 4 is input to the gate of each of the transistors Q1, Q2, and Q3, to control the ON and OFF switching of each of the transistors Q1, Q2, and Q3. That is, in such case, the transistors Q1-Q3 are each driven by a separate drive signal (e.g., a respectively different drive signal) from the IC controller 4.

The resistor R1 detects the electric current flowing through the solenoid 2. As such, the resistor R1 may be referred to as a shunt resistor R1. The terminal voltage of the resistor R1 (e.g., the inter-terminal voltage or voltage between the terminals of the resistor R1) is input to the IC controller 4. A current detection unit 5 included in the IC controller 4 may include, for example, an amplifier circuit (not shown). Based on a voltage obtained by amplifying the terminal voltage of the resistor R1, the current detection unit 5 can detect a solenoid current, that is, the electric current flowing through the solenoid 2.

The voltages at the terminals P1 and P2 are input to the IC controller 4. The IC controller 4 may also include a voltage detection unit 6. The voltage detection unit 6 may include, for example, a voltage dividing circuit, i.e., a voltage divider (not shown). The voltage detection unit 6 can detect a voltage of the upstream terminal of the solenoid 2 based on the voltage obtained by dividing the voltage of the terminal P1. The voltage detection unit 6 can also detect a voltage of the downstream terminal of the solenoid 2 based on the voltage obtained by dividing the voltage of the terminal P2. The voltage detection unit 6 detects an application voltage applied to the solenoid 2 based on the voltages of the upstream and downstream terminals of the solenoid 2, as described above. As such, the voltage detection unit 6 may be referred to as both a terminal voltage detector and an application voltage detector.

One terminal of the capacitor C1 is connected to the bootstrap terminal of the IC controller 4 and the other terminal of the capacitor C1 is connected to the source of the transistor Q1 via the resistor R2. The source of the transistor Q1 is connected to the bootstrap terminal of the IC controller 4. The capacitor C1 and the resistor R2 together with a diode in the IC controller 4 (not shown) make up a bootstrap circuit 7 for generating an ON drive voltage for driving (i.e., turning) the transistor Q1 ON.

The drive controller 8 of the IC controller 4 controls the operation of the drive circuit 3 based on: an instruction given from an external computer/controller, that is, a computer or processing device external to the injection control device 1 (not shown); a result of the current detection by the current detection unit 5; and a result of the voltage detection by the voltage detection unit 6. That is, the drive controller 8 in the IC controller 4 controls the ON and OFF switching of the transistors Q1-Q3 based on an instruction from an external computer, the current detection, and the voltage detection. Specifically, when an instruction to energize the solenoid 2 is input to the IC controller 4 from the external computer, the IC controller 4 drives the transistor Q3 ON and repeatedly switches the transistor Q1 ON and OFF. At the same time, the controller IC 4 also controls the drive of the transistor Q1 so that the solenoid current has a desired value based on a detection result of the electric current by the current detection unit 5. In such manner, the drive controller 8 turns ON the transistor Q1 and turns ON the transistor Q3 to drive the solenoid 2.

Since the transistor Q1 is an n-type MOSFET, a drive voltage higher than the battery voltage VB is required to drive the transistor Q1 ON. However, the power supply voltage supplied to the IC controller 4 is, for example, 5 V, which is lower than the battery voltage VB. Consequently, the drive controller 8 in the IC controller 4 generates the ON drive voltage of the transistor Q1 by using the above-described bootstrap circuit 7.

The operation of the injection control device 1, configured as described above, is described with reference to FIG. 2. In about the first half of a drive period TQ for driving the solenoid 2 (e.g., t1-t5), the drive controller 8 controls the solenoid current to have a first set value. In about the second half of the drive period TQ (e.g., t5-t7), the drive controller 8 controls the solenoid current to have a second set value, where the second set value is lower than the first set value.

At time t1, the drive controller 8 drives the transistors Q1 and Q3 to ON. Time t1 is the starting time of the drive period TQ for driving the solenoid 2. As a result, the battery voltage VB is applied to the solenoid 2, and the solenoid current starts to increase. In addition, the drive controller 8 drives the transistor Q2 to OFF at time t1. As a result, the diode D2 is in a non-short circuited state. That is, the diode D2 between the two ends of its terminals may function as if in a non-short circuited state (e.g., as an open circuit equivalent or with some resistance).

The drive controller 8 drives the transistor Q1 to OFF at time t2 when the solenoid current reaches a first upper limit value. The first upper limit value of the solenoid current is based on the first set value. As a result of switching the transistor Q1 to OFF, the application voltage to the solenoid 2 becomes 0 V, and the solenoid current starts to decrease. After a predetermined amount of time elapses (e.g., the period from time t2 to t3), the drive controller 8 drives the transistor Q1 to ON at time t3. At time t3, the solenoid current decreases to reach a first lower limit value, where the first lower limit value may be based on the first set value. When the solenoid current decreases to reach the first lower limit value, the drive controller 8 drives the transistor Q1 to ON.

As a result, at time t3 the battery voltage VB is applied to the solenoid 2, and the solenoid current starts to increase again. The drive controller 8 drives the transistor Q1 to OFF at time t4 when the solenoid current has increased to reach the first upper limit value. As a result, at time t4, the application voltage to the solenoid 2 becomes 0 V and the solenoid current starts to decrease again. In the first half of the drive period TQ, the drive controller 8 repeats such control to supply the solenoid 2 with an electric current at the first set value.

After the above-described predetermined period lapses (e.g., the period from time t1 to t5), the drive controller 8 performs another ON and OFF drive of the transistor Q1 until the end of the drive period TQ. That is, at time t5 when the solenoid current decreased to reach a second lower limit value, the drive controller 8 drives the transistor Q1 to ON. The second lower limit value is based on the second set value. As a result, at time t5 the battery voltage VB is applied to the solenoid 2, and the solenoid current starts to increase again.

The drive controller 8 drives the transistor Q1 to OFF at time t6 when the solenoid current increases to reach the second upper limit value that is set based on the second set value. As a result, at time t6, the application voltage to the solenoid 2 becomes 0 V and the solenoid current starts to decrease again. In the second half of the drive period TQ (e.g., from time t5 to time t7), the drive controller 8 repeats such control to supply electric current to the solenoid 2 at the second set value.

The drive controller 8 drives the transistor Q2 to ON at time t2 when the solenoid current reaches the first upper limit value and the transistor Q1 is driven to OFF. The drive controller 8 drives the transistor Q2 ON and OFF until the end of the drive period TQ based on the forward current flow to the solenoid 2 as controlled by the transistors Q1 and Q3. That is, in the first half of the drive period TQ where electric current at the first set value is supplied to the solenoid 2, the drive controller 8 drives the transistor Q2 to OFF at time t3 when the solenoid current has decreased to reach the first lower limit value. The drive controller 8 drives the transistor Q2 to ON at time t4 when the solenoid current increases to reach the first upper limit value.

In the second half of the drive period TQ where the electric current at the second set value is supplied to the solenoid 2, the drive controller 8 drives the transistor Q2 to OFF at time t5 when the solenoid current decreases to reach the second lower limit value. The drive controller 8 drives the transistor Q2 to ON at time t6 when the solenoid current increases to reach the second upper limit value.

The drive controller 8 drives the transistors Q1 and Q3 to OFF at time t7 when the drive period TQ ends. By driving the transistors Q1 and Q3 to OFF at time t7, the solenoid current decreases down to zero as time lapses, reaching a zero current level at time t8. When the solenoid current reaches zero at time t8, the drive controller 8 drives the transistor Q2 to OFF. The drive controller 8 is configured to drive the transistor Q2 to ON when the transistor Q1 is turned OFF and the current supply to the solenoid 2 is cut off. In other words, when a forward current greater than zero is flowing through the solenoid 2, the drive controller 8 drives the transistor Q2 to ON when the supply of the forward electric current to the solenoid 2 is cut off in response to driving the transistor Q1 to OFF. As a result, when the supply of the electric current to the solenoid 2 is interrupted, the diode D2 (i.e., between the terminals of the diode D2) functions in a short circuited state, and a return current flows through the transistor Q2 that is in an ON state. The forward current described above is the electric current flowing through the solenoid 2 from the upstream terminal to the downstream terminal.

In such a case, a total ON time Ts for the transistor Q2 where the diode D2 functions in a short circuited state during the drive period TQ is derived by subtracting the time Tq1 from the drive period TQ, as shown in Equation (1). Tq1 is the total ON time for the transistor Q1 in the drive period TQ.

$$Ts=TQ-Tq1 \qquad \text{Equation (1)}$$

The following advantageous effects can be achieved and realized by the present embodiment. In the injection control device 1 of the present embodiment, when the transistors Q1 and Q3 are turned ON, the battery voltage VB is applied to the solenoid 2. When the transistor Q2 is turned OFF, the diode D2 functions in a non-short circuited state, and when the transistor Q2 is turned ON, the diode D2 functions in a short circuited state.

The transistor Q2 is turned ON when the transistor Q1 is turned OFF during the period from time t1 to time t8, which includes the drive period TQ from time t1 to t7 and the following period from time t7 to time t8 when the drive current falls to zero. In other words, when a forward current flows through the solenoid 2, the transistor Q2 is configured to turn OFF when the transistor Q1 is turned ON. In such a manner, when the electric current supply to the solenoid 2 is interrupted, the transistor Q2 turns ON and a return current flows through the transistor Q2. As such, no substantial forward current flows through the diode D2 during the flow period of the return current, because the return current flows through the transistor Q2 instead. In other words, even though the diode D2 acts like a short circuit when the transistor Q2 is turned ON, little to no current flows through the diode D2, and the return current flows through the transistor Q2 instead. As a result of substantially no forward current flowing through the diode D2 when the transistor Q2 is turned ON, the diode D2 exhibits little or no heat loss. In this case, heat loss is caused by the transistor Q2, but the heat loss caused by the transistor Q2 is nominal. That is, the heat loss by the transistor Q2 is much smaller than the heat loss by the diode D2, because the transistor Q2 is a MOSFET-type transistor.

Based on the above-described configuration of the injection control device 1, a greater reduction in heat loss can be achieved by the injection control device 1 of the present embodiment compared to the heat reduction effects of injection control devices used by related technology. Heat loss may increase and become more noticeable as the current supplied to the solenoid 2 increases. In other words, in larger engines with larger engine capacities and higher performance levels that use a greater amount of current to drive the solenoid 2, the heat loss may be more noticeable and the heat loss reduction effects exhibited by the injection control device 1 of the current embodiment can become even more beneficial, with the advantageous heat-loss-reducing effects of the current embodiment also becoming more noticeable.

When a forward current flows through the solenoid 2 (i.e., during a period of forward current flow), the drive controller 8 controls the ON and OFF switching of the transistors Q1 and Q2, to turn the transistor Q2 OFF when the transistor Q1 is ON. If the transistor Q2 is turned ON while the transistor Q1 is turned ON, switching both the transistors Q1 and Q2 ON at the same time may cause an excessive short circuit current to flow from the DC power supply line L1 to ground. However, by controlling the ON and OFF switching of the transistors Q1 and Q2 in the above-described manner, the injection control device 1 of the present embodiment prevents such a short circuit current.

The control logic of the present embodiment can be modified. For example, the drive controller 8 may control the transistor Q2 to be turned OFF at times when the application voltage to the solenoid 2, as detected by the voltage detection unit 6, is higher than zero (0 V). Similarly, the drive controller 8 may control the transistor Q2 to be turned ON at times when the application voltage is equal to or lower than zero (0 V). Even using such control, the total time in the drive period TQ during which the transistor Q2 is turned ON and the diode D2 functions in a short circuited state, is substantially the same as the total ON time Ts of the transistor Q2 calculated in equation (1).

Alternatively, the drive controller 8 may perform an ON control of the transistor Q2 at times when the voltage of the upstream terminal of the solenoid 2, as detected by the voltage detection unit 6, is lower than the voltage of the downstream terminal of the solenoid. Even using such control, the total ON time of the transistor Q2 in the drive period TQ during which the diode D2 functions in a short circuited state, is substantially the same as the total ON time Ts of the transistor Q2 calculated in equation (1).

Even with such example modifications, effects similar to those achieved and realized by the above-described embodiment can also be achieved by the above-described modifications. In each of the above-described example modifications, the transistor Q2 is controlled based on the detected value of the application voltage to the solenoid 2, or the detected value of the voltage of the upstream terminal and the detected value of the voltage of the downstream terminal of the solenoid 2. As a result, the above-described heat loss reduction effects can be better achieved and realized using the example modifications as compared with the control based on the detected value of the solenoid current alone. That is, by using the example modifications, the return current flowing through the transistor Q2 can be better controlled to better reduce the heat loss and realize the effects of the heat loss reduction.

Second Embodiment

Figure 3:
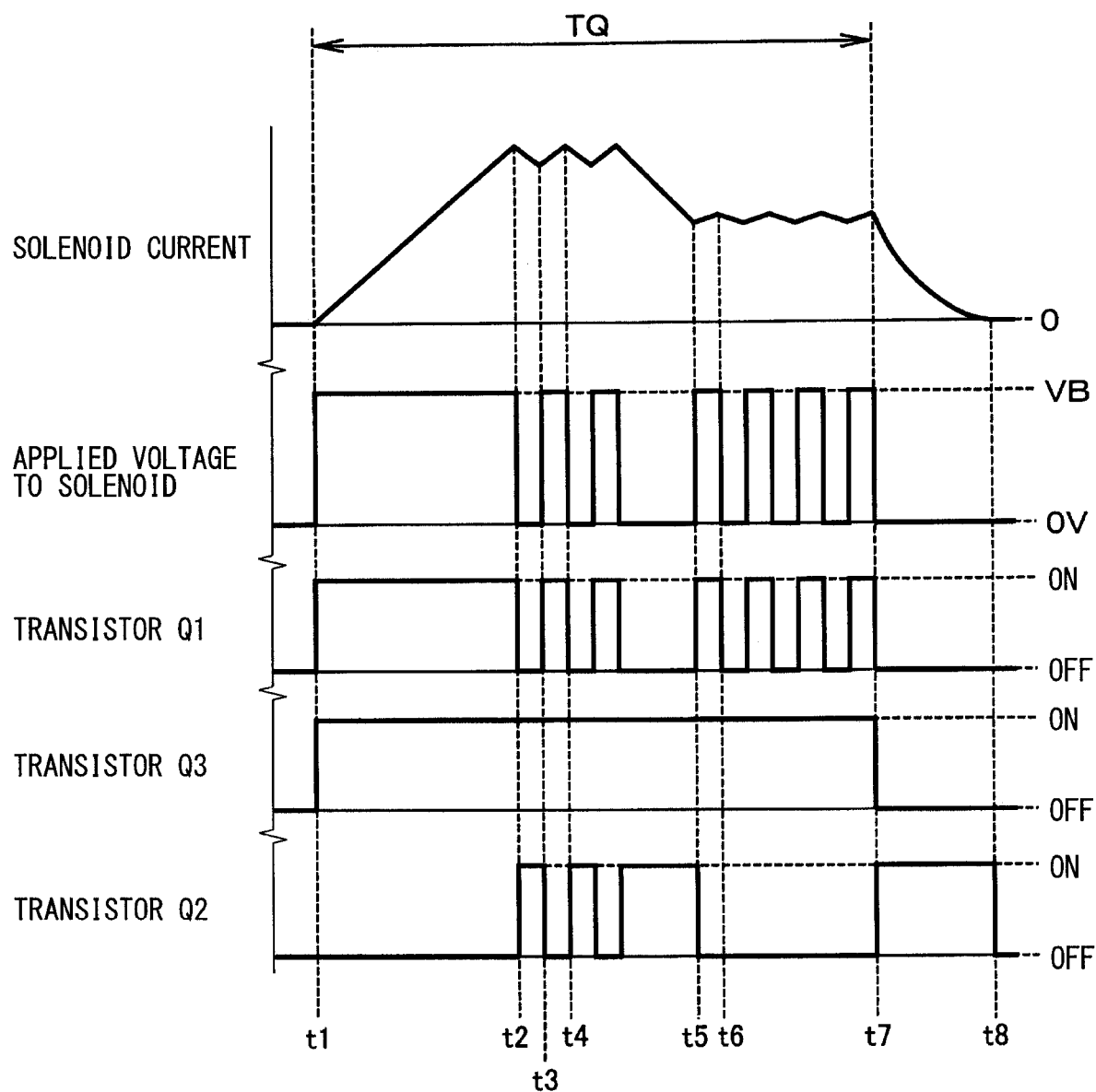
FIG. 3 is a timing chart of a solenoid current, an application voltage to a solenoid, and a drive state of each transistor in a second embodiment of the present disclosure.

The second embodiment of the present disclosure is described with reference to FIG. 3. The description of the second embodiment focuses on the difference in the control of solenoid 2 from the first embodiment. In the second embodiment, the configuration of the injection control device 1 is the same as the configuration of the injection control device in the first embodiment, as shown in FIG. 1.

In the control logic of the present embodiment, the ON and OFF control of the transistor Q2 is different from the control logic of the first embodiment. In the present embodiment, the drive controller 8 drives the transistor Q2 ON and OFF in the first half of the drive period TQ (e.g., from time t1 to time t5) just like it does in the first embodiment. However, the drive controller 8 drives the transistor Q2 to OFF in the second half of the drive period TQ (e.g., from time t5 to time t7).

Even with the control logic of the present embodiment, since the transistor Q2 is turned ON when the transistor Q1 is turned OFF for only a portion of the period where forward current flows through the solenoid 2, a heat loss reduction effect similar to first embodiment can be achieved and realized by the second embodiment. In such cases, though the return current in the first half of the drive period TQ flows through the transistor Q2 when the transistor Q2 is ON, the return current in the second half of the drive period TQ flows through the diode D2.

The current flowing through the solenoid in the first half of the drive period TQ is larger than the current flowing through the solenoid in the second half of the drive period TQ. As a result, the return current in the first half of the drive period TQ is also larger than the return current in the second half of TQ. Consequently, even when the return current is configured to flow through the transistor Q2 in only the first half of the drive period TQ, a significant heat loss reduction can still be achieved by the present embodiment as compared to the injection control devices used by related technologies.

Third Embodiment

Figure 4:
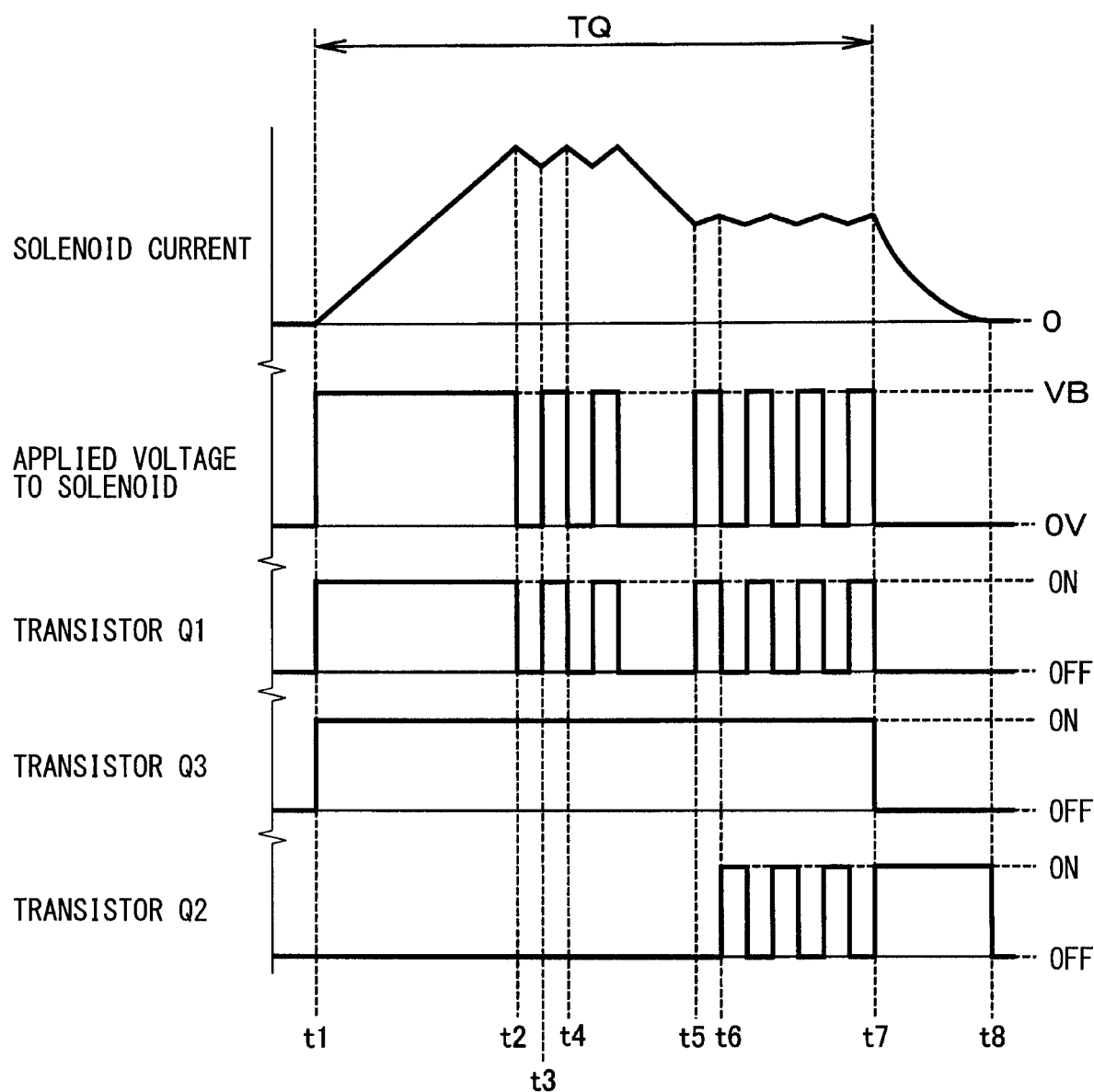
FIG. 4 is a timing chart of a solenoid current, an application voltage to a solenoid, and a drive state of each transistor in a third embodiment of the present disclosure.

The third embodiment of the present disclosure is described with reference to FIG. 4. The description of the third embodiment focuses on the differences in the control of the solenoid 2 from the previous embodiments. In the third embodiment, the configuration of the injection control device 1 is the same as the configuration of the injection control device in the first embodiment, as shown in FIG. 1.

In the control logic of the present embodiment, the ON and OFF control of the transistor Q2 is different from that of the control logic of the previous embodiments. In the present embodiment, the drive controller 8 drives the transistor Q2 ON and OFF in the second half of the drive period TQ (e.g., from time t6 to time t7) similar to the control in the first embodiment. However, in the present embodiment, the drive controller 8 drives the transistor Q2 to OFF in the first half of the drive period TQ (e.g., from time t1 to time t6).

Even with the control logic of the present embodiment, since the transistor Q2 is turned ON when the transistor Q1 is turned OFF for only a portion of the period where a forward current flows through the solenoid 2, heat loss reduction effects similar to the previous embodiments can be achieved and realized by the third embodiment. In such cases, though the return current in the second half of the drive period TQ flows through the transistor Q2 when the transistor Q2 is ON, the return current in the first half of the drive period TQ flows through the diode D2.

In the third embodiment, the voltage application to the solenoid in the second half of the drive period TQ may be longer than the first half of the drive period TQ, depending on how the solenoid is controlled. Consequently, even when the return current is configured to flow through the transistor Q2 in only the second half of the drive period TQ, a significant heat loss reduction can still be achieved by the present embodiment as compared to the injection control devices in related technologies.

Other Embodiments

The present disclosure is not limited to the embodiments described above and illustrated in the drawings, and can be arbitrarily modified, combined, or expanded without departing from the scope of the injection control device described in the description. Numerical values given in the above embodiments are examples only, and are not intended to be limiting.

The present disclosure is not limited to an injection control device in an engine ECU that controls the fuel injection of an engine, but can also be applied generally to an injection control device that controls the drive of a solenoid of a high pressure pump for pressurizing fuel to an internal combustion engine. In other words, the above-described embodiments are not limited to use in an engine ECU.

The transistors Q1, Q2, and Q3 are not limited to n-type MOSFETs, and various types of semiconductor switching elements can also be used. The reflux diode is not limited to the diode used as the body diode of the transistor Q2, and one or more additional diodes may be used as reflux diodes.

The drive controller 8 may drive the transistor Q2 to OFF in the period from time t7 to time t8 after the drive period TQ ends at time t7. In cases where the drive controller 8 turns the transistor Q2 OFF, the return current flows through the reflux diode D2 in the period from time t7 to time t8, that is, after the drive period TQ until the solenoid current falls to zero. During this period where the solenoid current decreases toward zero, the return current is also relatively small. Consequently, by turning OFF the transistor Q2 in the period from time t7 to time t8, the injection control device 1 of the present disclosure can achieve sufficiently less heat loss than the injection control devices used by related technologies.

Although the present disclosure has been described in accordance with the embodiments, it should be understood that the present disclosure is not limited to those embodiments and structures described herein. The present disclosure covers various modification examples and equivalent arrangements. Furthermore, various combinations of the embodiments, where such combinations may add additional elements to the resulting combination or remove elements from the resulting combination, are understood to be included within the scope of the present disclosure.

What is claimed is:

1. An injection control device for controlling a drive of a solenoid in a high pressure pump that pressurizes fuel to an internal combustion engine, the injection control device comprising:
    an upstream switch disposed on an upstream side of a power supply path that extends from a direct current (DC) power supply line that supplies a DC voltage to the solenoid;
    a downstream switch disposed on a downstream side of the power supply path;
    a reflux diode disposed at a position between an upstream terminal of the solenoid and ground, an anode of the reflux diode connected to ground;
    a short circuit switch disposed at a position between the upstream terminal of the solenoid and ground, the short circuit switch arranged in parallel with the reflux diode; and
    a drive controller configured to control the drive of the solenoid by controlling an ON and OFF switching of the upstream switch, the downstream switch, and the short circuit switch, wherein
    the drive controller is further configured to drive the solenoid to an open position by switching ON the downstream switch and the upstream switch.

2. The injection control device of claim 1, wherein
    the drive controller is further configured to switch OFF the short-circuit switch when a forward current flows in the solenoid and the upstream switch is switched ON.

3. The injection control device of claim 1 further comprising:
    an application voltage detector configured to detect an application voltage applied to the solenoid, wherein
    the drive controller is further configured to switch the short circuit switch OFF when the application voltage detected by the application voltage detector is a voltage greater than zero.

4. The injection control device of claim 1 further comprising:
    an application voltage detector configured to detect an application voltage applied to the solenoid, wherein
    the drive controller is further configured to switch the short circuit switch ON when the application voltage detected by the application voltage detector is a voltage less than or equal to zero.

5. The injection control device of claim 1 further comprising:
    a terminal voltage detector configured to detect a terminal voltage of the solenoid, wherein
    the drive controller is further configured to switch the short-circuit switch ON when the terminal voltage detector detects that a voltage at the upstream terminal of the solenoid is less than a voltage at the downstream terminal of the solenoid.

* * * * *